United States Patent
Shen et al.

(10) Patent No.: US 9,257,568 B2
(45) Date of Patent: Feb. 9, 2016

(54) STRUCTURE FOR FLASH MEMORY CELLS

(71) Applicant: Taiwan Semiconductor Manufacturing Company, Ltd., Hsin-Chu (TW)

(72) Inventors: Ming-Hui Shen, Dounan Town (TW); Shih-Chang Liu, Alian Township (TW); Chi-Hsin Lo, Zhubei (TW); Chia-Shiung Tsai, Hsin-Chu (TW); Tsun Kai Tsao, Yongkang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 58 days.

(21) Appl. No.: 13/854,520

(22) Filed: Apr. 1, 2013

(65) Prior Publication Data

US 2013/0234226 A1    Sep. 12, 2013

Related U.S. Application Data

(62) Division of application No. 12/765,658, filed on Apr. 22, 2010, now Pat. No. 8,445,953.

(60) Provisional application No. 61/223,963, filed on Jul. 8, 2009.

(51) Int. Cl.
*H01L 29/788*     (2006.01)
*H01L 27/115*     (2006.01)
*H01L 21/8234*    (2006.01)

(52) U.S. Cl.
CPC ........ *H01L 29/788* (2013.01); *H01L 27/11521* (2013.01); *H01L 21/823468* (2013.01)

(58) Field of Classification Search
USPC .................................................. 257/314–316
IPC ................................................. H01L 21/823468
See application file for complete search history.

(56) References Cited

U.S. PATENT DOCUMENTS

| | | | | |
|---|---|---|---|---|
| 5,915,176 | A * | 6/1999 | Lim | 438/257 |
| 6,114,723 | A | 9/2000 | Leu | |
| 6,136,563 | A | 10/2000 | Cunningham et al. | |
| 6,297,097 | B1 | 10/2001 | Jeong | |
| 6,469,341 | B1 | 10/2002 | Sung et al. | |
| 6,486,506 | B1 | 11/2002 | Park et al. | |
| 6,608,347 | B2 * | 8/2003 | Sato | 257/316 |
| 6,617,085 | B1 | 9/2003 | Kanh et al. | |
| 6,627,927 | B2 * | 9/2003 | Wu | 257/213 |
| 6,706,602 | B2 | 3/2004 | Hsu et al. | |
| 6,707,089 | B2 | 3/2004 | Kim et al. | |
| 6,746,918 | B2 * | 6/2004 | Wu | 438/257 |
| 6,747,310 | B2 | 6/2004 | Fan et al. | |
| 6,844,602 | B2 | 1/2005 | Kwon | |
| 6,878,613 | B2 | 4/2005 | Stottko et al. | |
| 7,045,413 | B2 * | 5/2006 | Lee et al. | 438/230 |
| 7,074,692 | B2 | 7/2006 | Chen et al. | |

(Continued)

*Primary Examiner* — Eugene Lee
(74) *Attorney, Agent, or Firm* — Slater & Matsil, L.L.P.

(57) ABSTRACT

A flash memory cell structure is provided. A semiconductor structure includes a semiconductor substrate, a floating gate overlying the semiconductor substrate, a word-line adjacent to the floating gate, an erase gate adjacent to a side of the floating gate opposite the word-line, a first sidewall disposed between the floating gate and the word-line, and a second sidewall disposed between the floating gate and the erase gate. The first sidewall has a first characteristic and the second sidewall has a second characteristic. The first characteristic is different from the second characteristic.

20 Claims, 10 Drawing Sheets

(56) References Cited

U.S. PATENT DOCUMENTS

| | | |
|---|---|---|
| 7,355,237 B2 | 4/2008 | Lutze et al. |
| 7,700,473 B2 | 4/2010 | Liu et al. |
| 7,763,929 B2 * | 7/2010 | Sakagami .................... 257/315 |
| 7,800,155 B2 | 9/2010 | Matsuno |
| 7,829,404 B2 | 11/2010 | Klinger et al. |
| 8,148,766 B2 * | 4/2012 | Huang et al. .................. 257/314 |
| 8,227,850 B2 | 7/2012 | Liu et al. |
| 8,445,953 B2 * | 5/2013 | Shen et al. .................... 257/316 |
| 2004/0029354 A1 | 2/2004 | You et al. |
| 2004/0185616 A1 | 9/2004 | Ding |
| 2004/0256657 A1 | 12/2004 | Hung et al. |
| 2005/0014326 A1 | 1/2005 | Kobayashi et al. |
| 2006/0289924 A1 | 12/2006 | Wang |
| 2007/0018227 A1 | 1/2007 | Coronel et al. |
| 2008/0105917 A1 | 5/2008 | Hsieh et al. |
| 2008/0121954 A1 | 5/2008 | Shuto |
| 2008/0121975 A1 | 5/2008 | Hsieh et al. |
| 2008/0248620 A1 | 10/2008 | Liu et al. |
| 2009/0039410 A1 | 2/2009 | Liu et al. |

* cited by examiner

STRUCTURE FOR FLASH MEMORY CELLS

This application is a divisional of U.S. patent application Ser. No. 12/765,658 filed Apr. 22, 2010 entitled, "Novel Structure for Flash Memory Cells," which application further claims the benefit of priority of U.S. Provisional Application No. 61/223,963, entitled "Novel Structure for Flash Memory Cells," filed on Jul. 8, 2009, which applications are hereby incorporated herein by reference.

TECHNICAL FIELD

The present invention relates generally to semiconductor devices, and more particularly to the structures and manufacturing methods of flash memory cells.

BACKGROUND

Flash memories have become increasingly popular in recent years. A typical flash memory comprises a memory array having a large number of memory cells arranged in blocks. Each of the memory cells is fabricated as a field-effect transistor having a control gate and a floating gate. The floating gate is capable of holding a charge and is separated from source and drain regions contained in a substrate by a layer of thin oxide. Each of the memory cells may be electrically charged by injecting electrons from the substrate through the oxide layer onto the floating gate. The charge may be removed from the floating gate by tunneling the electrons to the source region or an erase gate during an erase operation. The data in flash memory cells are thus determined by the presence or absence of electrical charges in the floating gates.

FIG. 1 illustrates two exemplary prior art flash memory cells 2 and 20, wherein flash memory cells 2 and 20 share a common source region 16 and a common erase gate 18. Flash memory cell 2 includes a floating gate 4, a control gate 6 over and electrically insulated from floating gate 4, and a word-line node 10 over a channel 12 and on sidewalls of floating gate 4 and control gate 6. Word-line 10 controls the conduction of channel 12, which is between bit-line node 14 and source region 16. During a program operation, a voltage is applied between bit-line node 14 and source region 16, with, for example, a bit-line node voltage of about 0.4V and a source voltage of about 5V. Word-line 10 is applied with a voltage of 1.1V to turn on channel 12. Therefore, a current (hence electrons) flows between bit-line node 14 and source region 16. A high voltage, for example, about 10V, is applied on control gate 6, and thus the electrons are programmed into floating gate 4 under the influence of a high electrical field. During an erase operation, a high voltage, for example, 11V is applied to erase gate 18. Word-line 10 is applied with a low voltage such as 0V, while source region 16, bit-line node 14 and control gate 6 are applied with a voltage of 0V. Electrons in floating gate 4 are thus driven into erase gate 18.

FIG. 2a illustrates a cross-sectional view of a structure 200 of prior art flash memory cells. Structure 200 of flash memory cells displays the presence of a spacer 205 between word-line 10 and floating gate 4. Spacer 205 may be used to prevent or reduce leakage current between word-line 10 and floating gate 4, as well as preventing induced reverse tunneling voltage failure. Therefore, spacer 205 may be created with a desired thickness that is based on manufacturing process. Furthermore, spacer 205 should have uniform thickness, which may lead to more consistent behavior. Typically, spacer 205 is formed from an oxide layer. However, spacer 205 formed solely from an oxide layer may be prone to damage from other fabrication process steps and uniformity may be difficult to achieve with an oxide layer alone.

FIGS. 2b and 2c illustrate cross-sectional views of structures of prior art flash memories. FIG. 2b illustrates a thin spot 210 formed in spacer 205 (formed from an oxide layer) that results from residue from an etch operation. Thin spot 210 in spacer 205 may lead to increased leakage current and/or induced reverse tunneling voltage failure due to non-uniformity in spacer 205. FIG. 2c illustrates a sharp point 215 in a floating gate poly layer interface with a word-line. Sharp point 215, resulting from a poly etch, may lead to increased leakage current and/or induced reverse tunneling voltage failure.

There is therefore, a need for flash memories having consistent and uniform spacers between floating gates and word-lines, as well as more consistent spacers, to reduce leakage current and to prevent induced reverse tunneling voltage failure. This need may continue to increase in importance as fabrication process feature sizes continue to decrease.

SUMMARY

These and other problems are generally solved or circumvented, and technical advantages are generally achieved, by embodiments of structures and manufacturing methods of flash memory cells.

In accordance with an embodiment, a semiconductor structure is provided. The semiconductor structure includes a semiconductor substrate, a floating gate overlying the semiconductor substrate, and a word-line adjacent to the floating gate. The semiconductor structure also includes an erase gate adjacent to a side of the floating gate opposite the word-line, a first sidewall disposed between the floating gate and the word-line, and a second sidewall disposed between the floating gate and the erase gate. The first sidewall having a first characteristic and the second sidewall having a second characteristic. The first characteristic is different from the second characteristic.

In accordance with another embodiment, a semiconductor structure is provided. The semiconductor structure includes a semiconductor substrate, a first floating gate disposed on the semiconductor substrate, a first word-line adjacent to the first floating gate, and an erase gate adjacent to a side of the first floating gate opposite the first word-line. The semiconductor structure also includes a first control gate disposed on the first floating gate, a first separation layer disposed between the first control gate and the first floating gate, a first oxide layer disposed between the first floating gate and the first word-line, a first isolation layer disposed between the first word-line and the first oxide layer, and a second oxide layer disposed between the first floating gate and the erase gate.

An advantage of an embodiment is that a high quality oxide spacer with good uniformity is provided to improve induced reverse tunneling voltage failure by widening process window, and an additional isolation layer is provided to improve leakage current performance.

A further advantage of an embodiment is that existing fabrication processes may be used with minor modification to several etching and layer deposition steps. This leads to simple implementation with small incurred costs.

Yet another advantage of an embodiment is that the elimination of a sharp point in a floating gate may help to reduce electric field intensification, which may reduce program function failures and increase yield.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely flash memory structures and methods of forming same. The intermediate stages of manufacturing preferred embodiments are illustrated. Throughout the various views and illustrative embodiments, like reference numbers are used to designate like elements.

Figure 1:
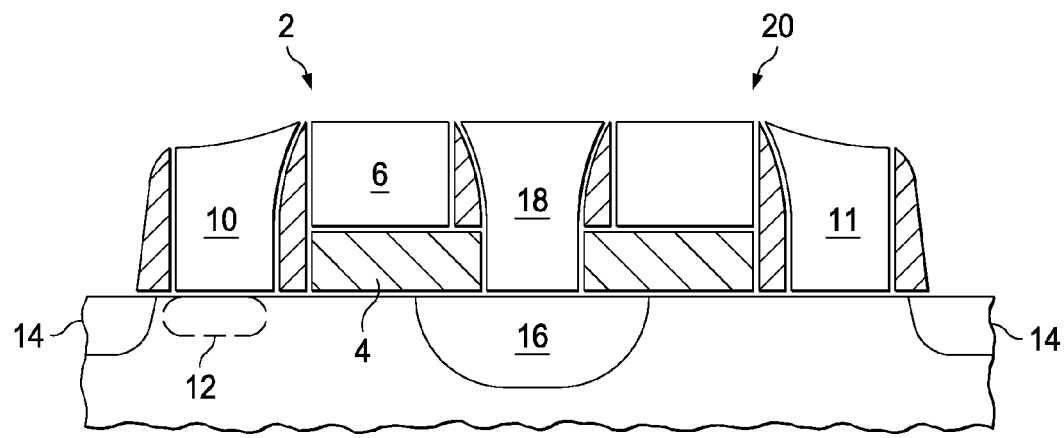
FIG. 1 is a diagram of a prior art structure of flash memory cells.
Figure 2A:
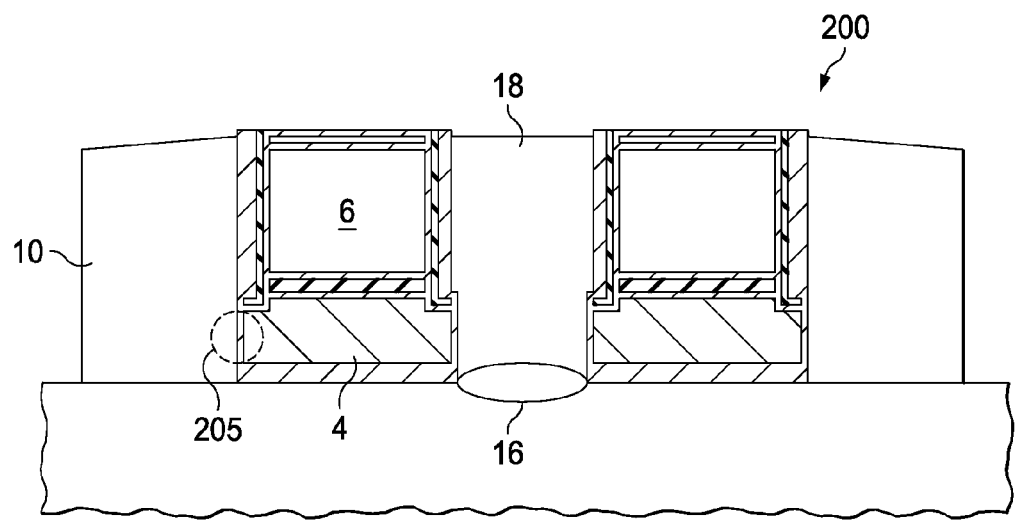
FIG. 2a is a diagram of a schematic of a portion of a prior art structure of flash memory cells.
Figure 2B:
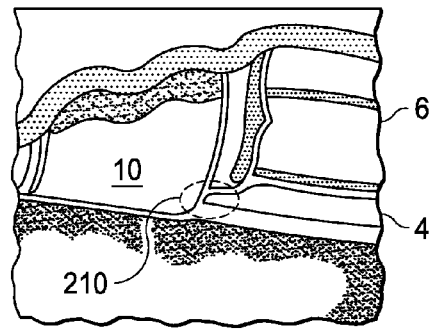
FIGS. 2b and 2c are diagrams of portions of a prior art structure of flash memory cells.
Figure 2C:
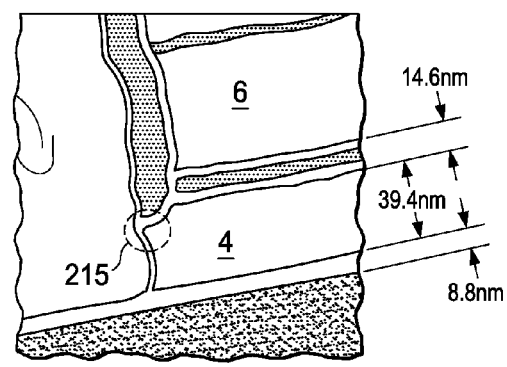
Figure 3:
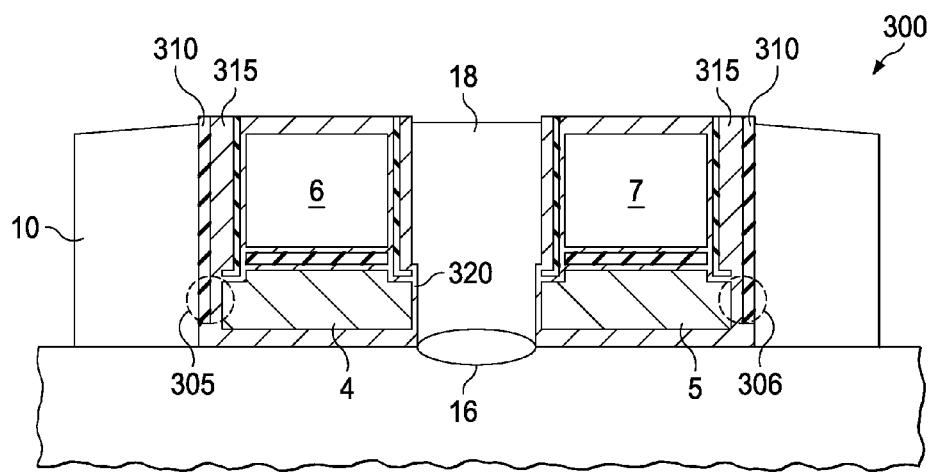
FIG. 3 is a diagram of a structure of flash memory cells with an enhanced spacer between a word-line and a floating gate.

FIG. 3 illustrates a cross-sectional view of a structure 300 of flash memory cells. Structure 300 of flash memory cells displays an enhanced spacer 305 between word-line 10 and floating gate 4. Enhanced spacer 305 comprises an isolation layer 310 and an oxide layer 315, wherein isolation layer 310 may help to improve leakage current performance, while oxide layer 315 may help to reduce reverse tunneling voltage failure. Isolation layer 310 may also help to protect oxide layer 315 from damage in fabrication process steps after the formation of oxide layer 315, such as various wet and dry etches. Structure 300 of flash memory cells also displays a second floating gate 5 and a second enhanced spacer 306. Floating gate 4 and floating gate 5 may be separated by common source region 16 and erase gate 18. Not shown in FIG. 3 are typical features in a flash memory cell, such as bit-lines, channels, and so forth.

On a side of floating gate 4 opposite enhanced spacer 305, a second oxide layer 320 separates floating gate 4 from erase gate 18. Although enhanced spacer 305 and second oxide layer 320 may have similar function, such as providing physical and electrical protection and isolation, they may have different characteristics. For example, their respective thicknesses may differ. Additionally, they may be created from different materials or their isolation capabilities to the ejection current of floating gate 4 may differ, and so forth.

Figure 4A:
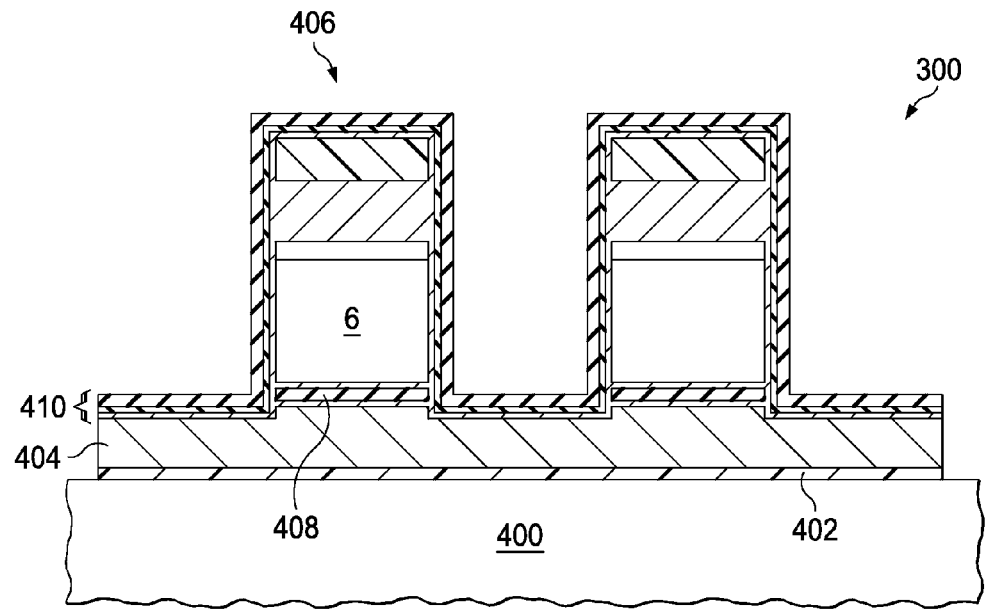
FIGS. 4a through 4j are diagrams of a structure of flash memory cells in intermediate stages of manufacturing.

FIG. 4a illustrates a structure 300 of flash memory cells formed on a semiconductor substrate 400. As is known in the art, semiconductor substrate 400 preferably includes silicon or other known semiconductor materials. A first layer 402 of structure 300 of flash memory cells may be a layer of resistor protect oxide (RPO) that may be used to block regions such as resistor regions, electrostatic discharge regions, or so forth, from forming silicide. A second layer 404 may be a layer of polysilicon that may be used to form floating gates. Second layer 404 may be formed from other conductive materials, such as metals, metal silicides, metal nitrides, and dielectric layers having high trapping densities such as silicon nitride, and so forth.

A remainder of structure 300 of flash memory cells comprises gate stacks, such as gate stack 406. Separating gate stack 406 from second layer 404, a third layer 408 comprising an oxide-nitride-oxide (ONO) layer that may be used to electrically isolate the floating gates from control gates, such as control gate 6 or control gate 7. Third layer 408 may be formed in multiple process steps, including the formation of a first oxide layer, a nitride layer, and a second oxide layer. A single oxide layer, a single high-k dielectric layer, a single nitride layer, and multi-layers thereof, may be used in place of the ONO layer to form third layer 408. A remainder of gate stack 406 includes a control layer and a cap layer. The control layer preferably includes polysilicon, although other conductive materials may also be used. The cap layer may include a bottom anti-reflective coating (BARC) and a photo resist formed on the BARC.

A control gate ONO layer 410, which may be used to later form control gate sidewall spacers, may be formed by depositing and patterning oxide, nitride, and oxide layers over structure 300 of flash memory cells as well as substrate 400. Control gate ONO layer 410 comprise dielectric materials such as tetra-ethyl-ortho-silicate (TEOS), silicon nitride, high temperature oxide (HTO), multi-layers thereof, and combinations thereof. The thickness of control gate ONO layer 410 is preferably less than about 300 Å.

Figure 4B:
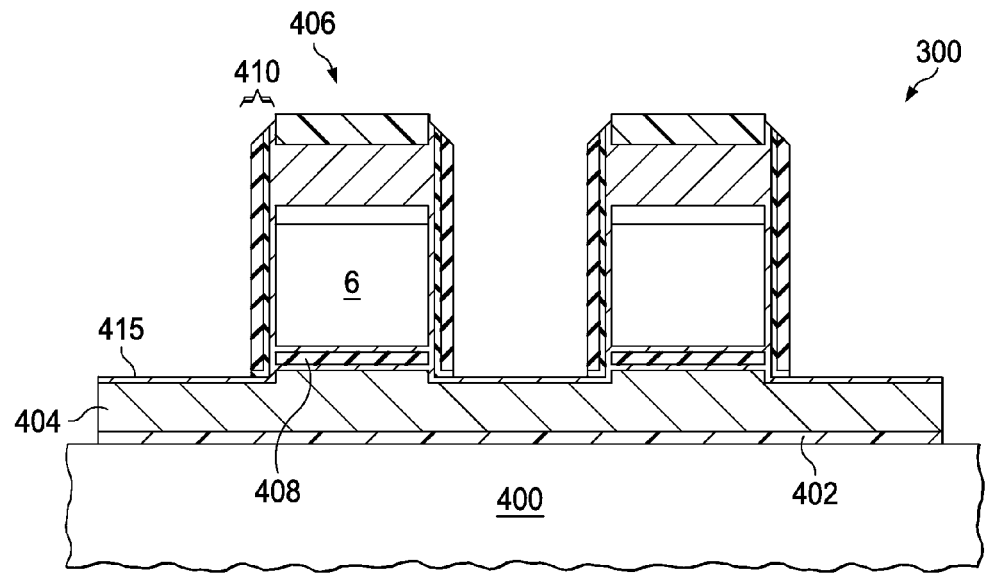

FIG. 4b illustrates a cross-sectional view of structure 300 of flash memory cells after completed formation of control gate ONO layer 410. Portions of control gate ONO layer 410 formed over second layer 404 may be removed by etching away undesired portions of control gate ONO layer 410 using a control gate ONO layer etch. Preferably, a dry etch may be used and the control gate ONO layer etch is stopped prior to an entirety of control gate ONO layer 410 is removed. By stopping the control gate ONO layer etch before the entirety of control gate ONO layer 410 is removed, a portion of an oxide layer 415 over second layer 404 remains.

Figure 4C:
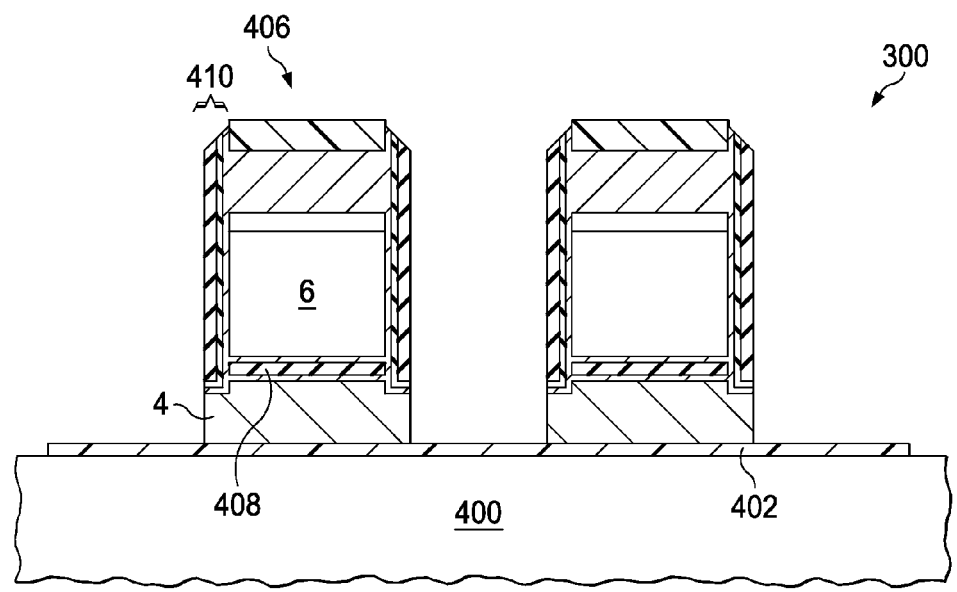

FIG. 4c illustrates a cross-sectional view of structure 300 of flash memory cells after floating gates, such as floating gate 4, has been formed using a polysilicon etch. Preferably, a photo resist may be patterned so that portions of second layer 404 to be removed are exposed. The exposed portions of second layer 404 may then be removed to form the floating gates. The etching of second layer 404 may be performed until substantially vertical edges of the floating gates are formed. If sidewalls of floating gates are to be recessed, a dry etch may be used. Otherwise, a wet etch may be preferred.

Figure 4D:
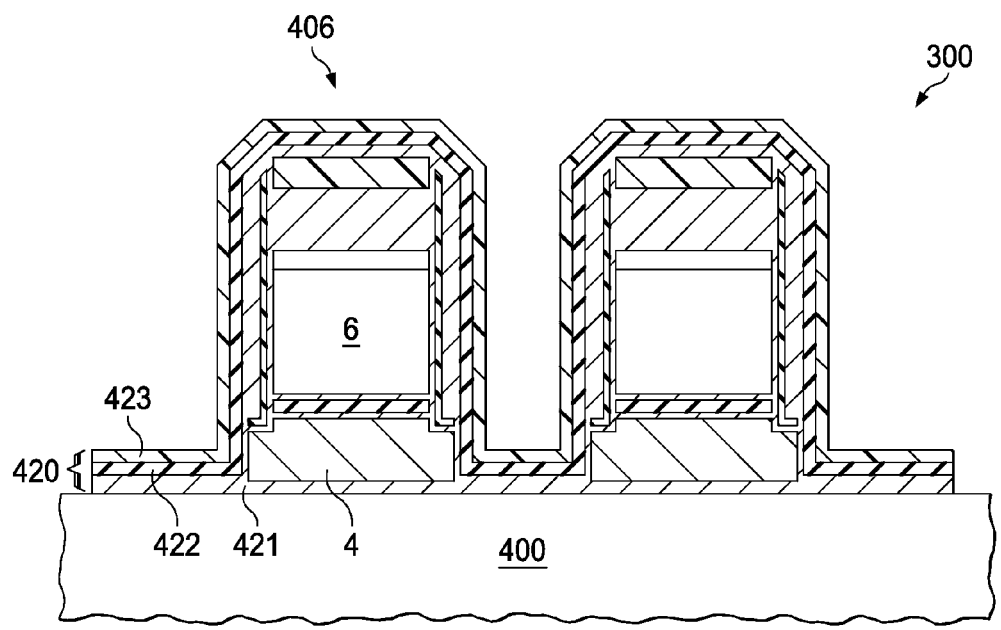

FIG. 4d illustrates a cross-sectional view of structure 300 of flash memory cells after a fourth layer 420 is formed. Fourth layer 420 comprises an ONO layer, wherein a first oxide layer 421 may be formed using high temperature oxidation (HTO) until an oxide layer of about 150 Å thick is formed, a nitride layer 422 may be formed by depositing a layer of silicon nitride about 70 Å thick, and a second oxide layer 423 may be formed using HTO until an oxide layer about 70 Å thick is formed. Fourth layer 420 comprises dielectric materials such as tetra-ethyl-ortho-silicate (TEOS), silicon nitride, high temperature oxide (HTO), multi-layers thereof, and combinations thereof.

Figure 4E:
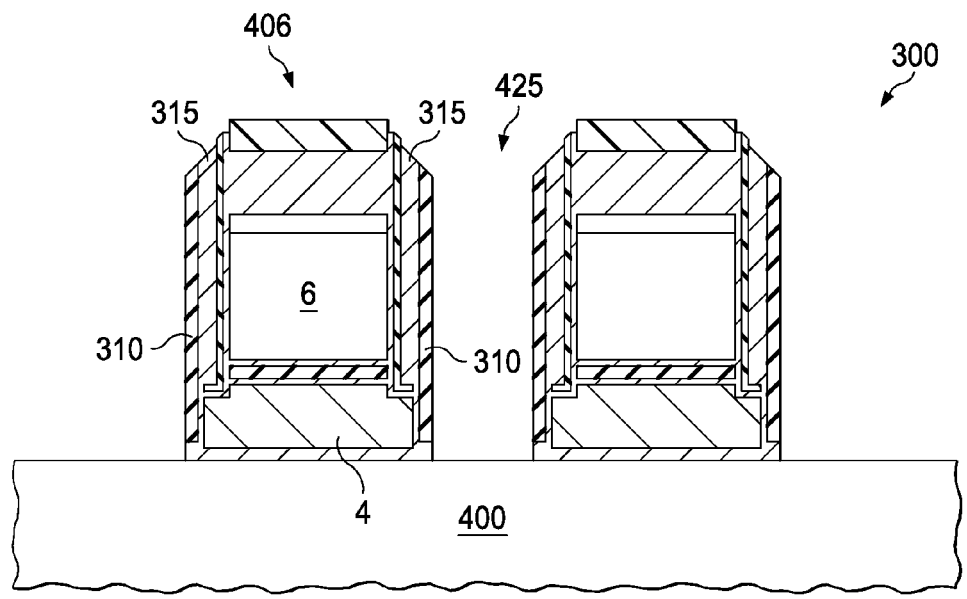

FIG. 4e illustrates a cross-sectional view of structure 300 of flash memory cells after isolation layers, such as isolation layer 310, is formed on sidewalls of gate stacks, such as gate stack 406. The isolation layers protect both sides of floating gates, such as floating gate 4, as well as a remainder of gate stacks. In addition to forming the isolation layer, oxide layers, such as oxide layer 315, may be formed on sidewalls of gate stacks, including floating gates. According to a preferred embodiment, the isolation layers and oxide layers may be formed by etching away portions of fourth layer 420, such as second oxide layer 423 and nitride layer 422 and first oxide layer 421. In particular, both wet and dry etching techniques may be used in conjunction with photo resist application, patterning, and removal to remove fourth layer 420 over portions of substrate 400 where fourth layer 420 is not desired, such as tops of gate stacks, position of word-lines, erase gates, and so on. While, on the sidewalls of gate stacks, at least a portion of nitride layer 422 is maintained along with first oxide layer 421, with the remaining portion of nitride layer 422 becoming isolation layer 310 and first oxide layer 421 becoming oxide layer 315. As shown in FIG. 4e, isolation layers and oxide layers may be formed on both sides of gate stacks, including the erase gate side of gate stacks (pointer 425 indicates where erase gate 18 will be formed in subsequent fabrication process steps).

Figure 4F:
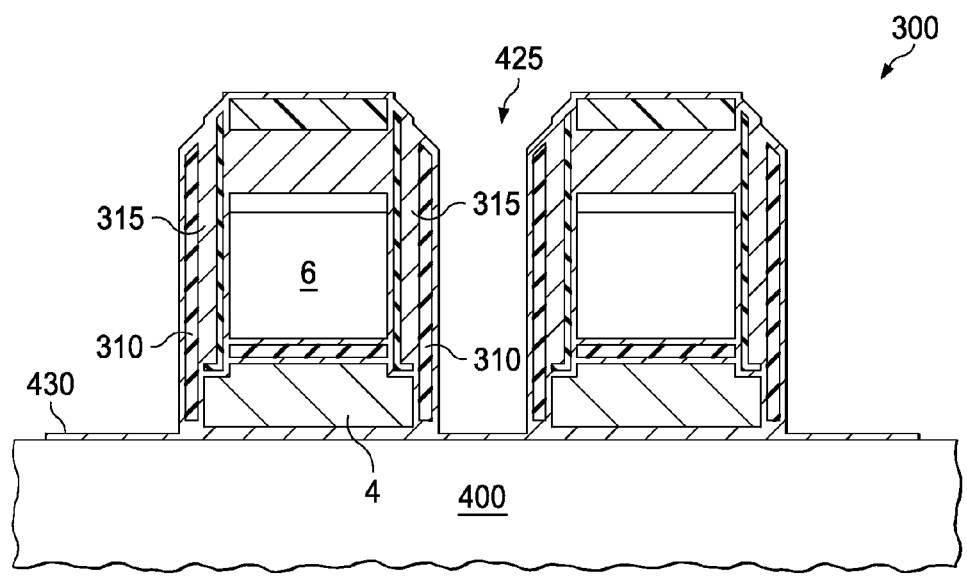

FIG. 4f illustrates a cross-sectional view of structure 300 of flash memory cells after fifth layer 430 is formed over structure 300 of flash memory cells as well as some portions of substrate 400. Fifth layer 430 may be used to provide protection for structure 300 of flash memory cells as well as substrate 400 from subsequent fabrication process steps. Preferably, a rapid thermal oxidation (RTO) technique may be used to form an oxide layer about 21 Å thick and a HTO technique may be used to form an oxide layer about 70 Å thick. According to an embodiment, either the RTO or the HTO technique may be performed first.

Figure 4G:
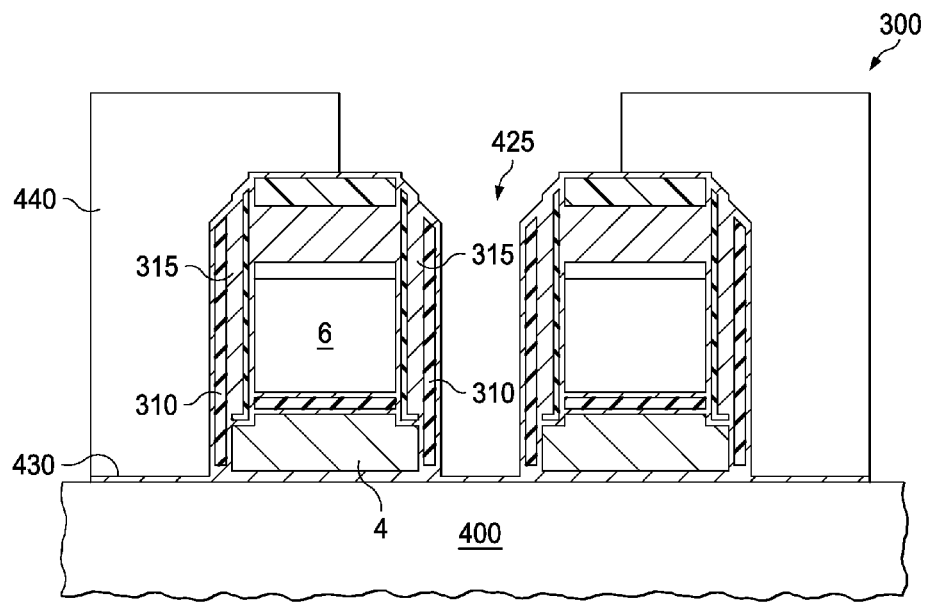

FIG. 4g illustrates a cross-sectional view of structure 300 of flash memory cells after photo resist has been applied, patterned, and portions of photo resist have been removed. After the photo resist has been applied (for example, by spin-on techniques), patterned (either with positive or negative mask patterning), and removed (by chemical wash, for example), portions of photo resist removed include photo resist over portions of structure 300 of flash memory cells where erase gates will be formed in subsequent fabrication process steps (shown with pointer 425). According to patterning, photo resist remains over portions of structure 300 of flash memory cells where word-lines will be formed in subsequent fabrication process steps (shown as photo resist 440), part of gate stacks, and so forth.

Figure 4H:
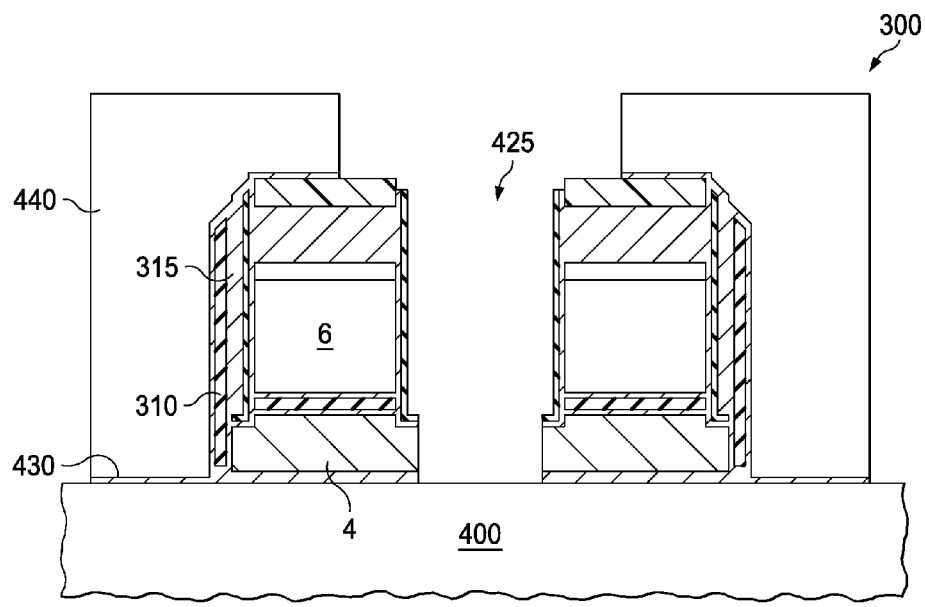

FIG. 4h illustrates a cross-sectional view of structure 300 of flash memory cells after portions of fifth layer 430, isolation layer 310, and oxide layer 315 that not covered by photo resist have been removed. According to an embodiment, exposed portions of fifth layer 430, isolation layer 310, and oxide layer 315 may be removed by an oxide wet etch, a lateral nitride etch, and an oxide wet etch, respectively.

Figure 4I:
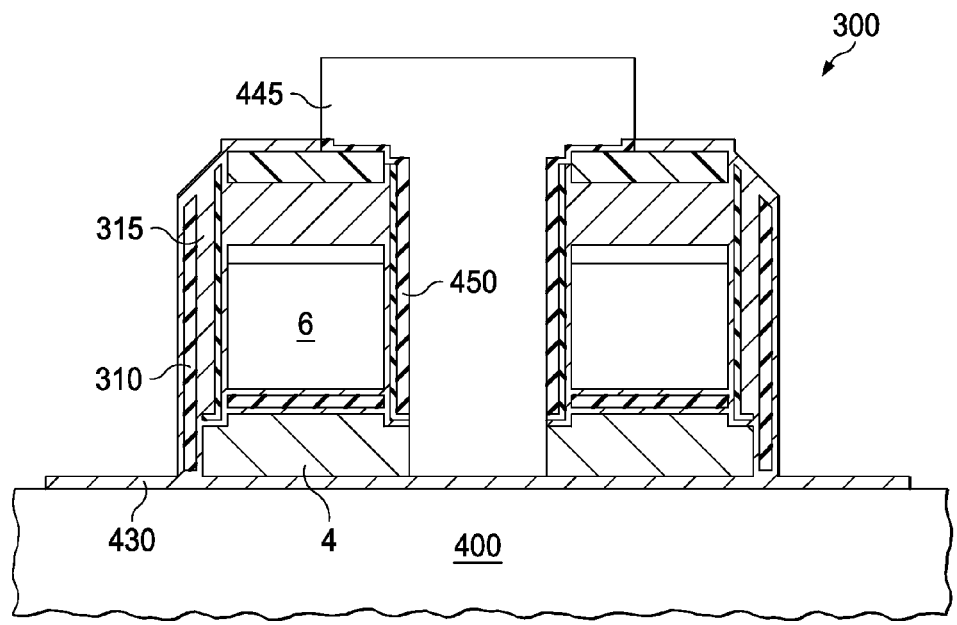

FIG. 4i illustrates a cross-sectional view of structure 300 of flash memory cells after photo resist has been applied, patterned, and portions of photo resist have been removed. After photo resist 440 covering portions of structure 300 of flash memory cells where word-lines will be formed have been removed, additional photo resist may be applied, patterned, and removed, to cover portions of structure 300 of flash memory cells where erase gates will be formed in subsequent fabrication process steps (shown as photo resist 445). This may leave portions of structure 300 of flash memory cells where word-lines will be formed in subsequent fabrication process steps, as well as other portions of substrate 400, exposed.

After removing photo resist 440 and prior to applying, patterning, and removing photo resist, a sixth layer 450 may be formed. Sixth layer 450 may protect portions of gate stacks exposed by the removal of portions of fifth layer 430, isolation layer 310, and oxide layer 315 (as shown in FIG. 4h) from subsequent fabrication process steps, such as the application of photo resist shown in FIG. 4i. Sixth layer 450 may be formed using RTO to create an oxide layer about 21 Å thick and HTO to create an oxide layer 85 Å thick. Again, the order of RTO and HTO may be reversed. The oxide layers created by RTO and HTO may just increase the thickness of fifth layer 430 on portions of substrate 400 and structure 300 of flash memory cells where fifth layer 430 remain.

Figure 4J:
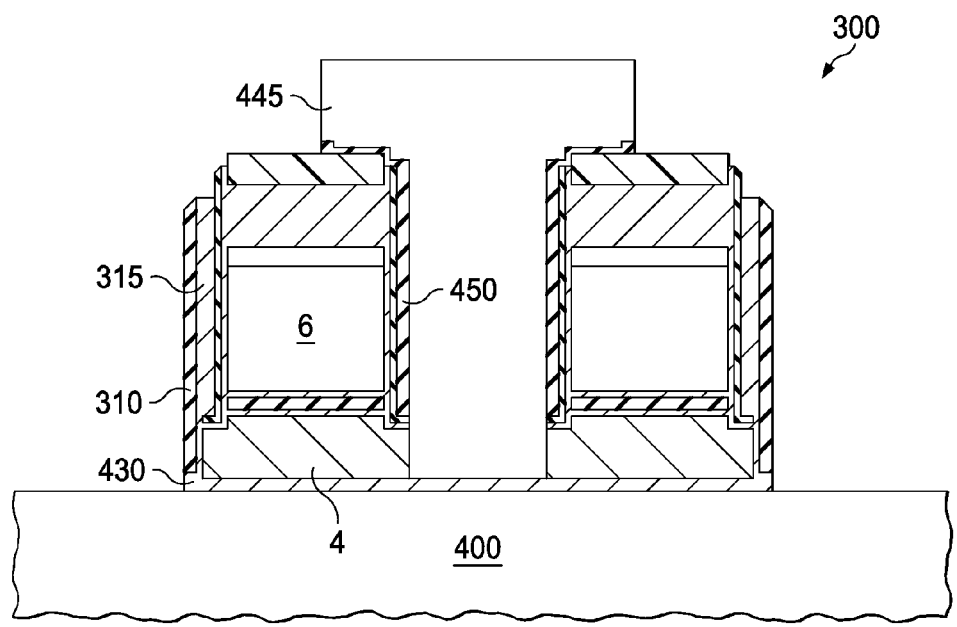

FIG. 4j illustrates a cross-sectional view of structure 300 of flash memory cells after fifth layer 430 has been removed. Fifth layer 430 may be removed using a wet etch technique, preferably. With the removal of fifth layer 430 from structure 300 of flash memory cells and substrate 400, the formation of isolation layer 310 and oxide layer 315 to protect floating gate 4 may be complete. Fabrication of structure 300 of flash memory cells may continue to completion with known fabrication process steps, which may include the formation of word-lines, erase gates, and so forth.

As discussed previously, a sharp point in a floating gate poly layer at the interface with a word-line may lead to increased leakage current and/or induced reverse tunneling voltage failure. The sharp point in a floating gate poly layer may also cause a program function failure (PFF) and may result in a yield loss of around 13.6 percent in a typical flash memory fabrication process. An electric field induced during a program operation to program the floating gate may be intensified at the very tip of the sharp point and potentially lead to the high yield loss by increasing induced reverse tunneling voltage failure, for example.

Figure 5:
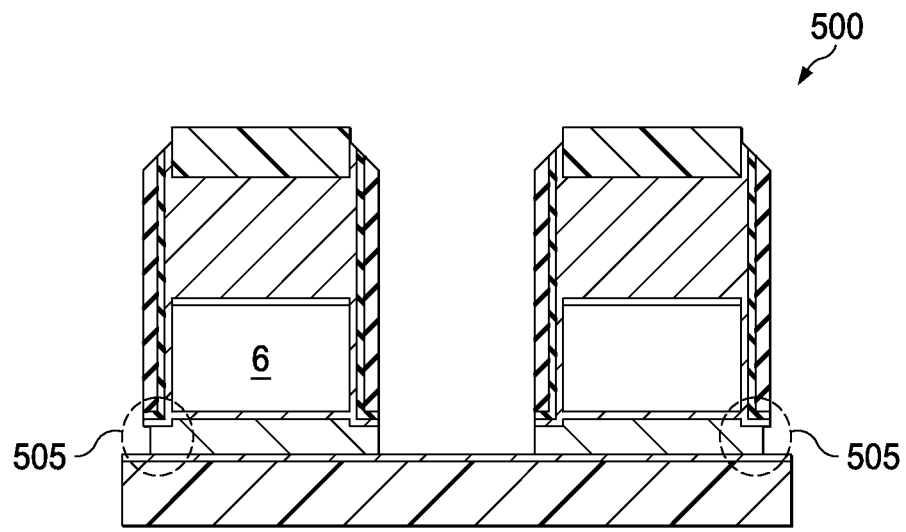
FIG. 5 is a diagram of a structure of flash memory cells with an enhanced spacer between a word-line and a floating gate.

FIG. 5 illustrates a cross-sectional view of a structure 500 of flash memory cells. Structure 500 of flash memory cells displays an enhanced floating gate having a relatively flat surface at its interface with a word-line (shown as highlights 505). The elimination of the sharp point in floating gate poly layer at the interface with the word-line may help to reduce the intensification of an electric field induced during floating gate programming, which in turn, may help reduce induced reverser tunneling voltage failure and decrease yield loss.

Figure 6A:
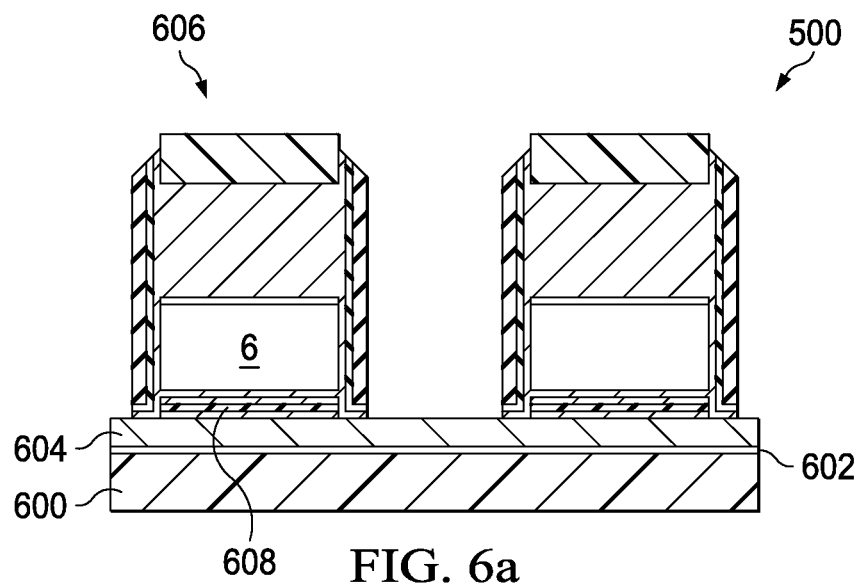
FIGS. 6a through 6e are diagrams of a structure of flash memory cells in intermediate stages of manufacture.

FIG. 6a illustrates a cross-sectional view of a structure 500 of flash memory cells formed on a semiconductor substrate 600. Structure 500 of flash memory cells may be similar to structure 300 of flash memory cells shown in FIG. 4b and may be the result of a control gate spacer etch. A first layer 602 of structure 500 of flash memory cells may be a layer of resistor protect oxide (RPO) that may be used to block regions such as resistor regions, electrostatic discharge regions, or so forth, from forming silicide. A second layer 604 may be a layer of polysilicon that may be used to form floating gates. Second layer 604 may be formed from other conductive materials, such as metals, metal silicides, metal nitrides, and dielectric layers having high trapping densities such as silicon nitride, and so forth.

A remainder of structure 500 of flash memory cells comprises gate stacks, such as gate stack 606. Separating gate stack 606 from second layer 604, a third layer 608 comprising an oxide-nitride-oxide (ONO) layer that may be used to electrically isolate the floating gates from control gates, such as control gate 6. Third layer 608 may be formed in multiple process steps, including the formation of a first oxide layer, a nitride layer, and a second oxide layer. A single oxide layer, a single high-k dielectric layer, a single nitride layer, and multilayers thereof, may be used in place of the ONO layer to form third layer 608. A remainder of gate stack 606 includes a control layer and a cap layer. The control layer preferably includes polysilicon, although other conductive materials may also be used. The cap layer may include a bottom antireflective coating (BARC) and a photo resist formed on the BARC.

Figure 6B:
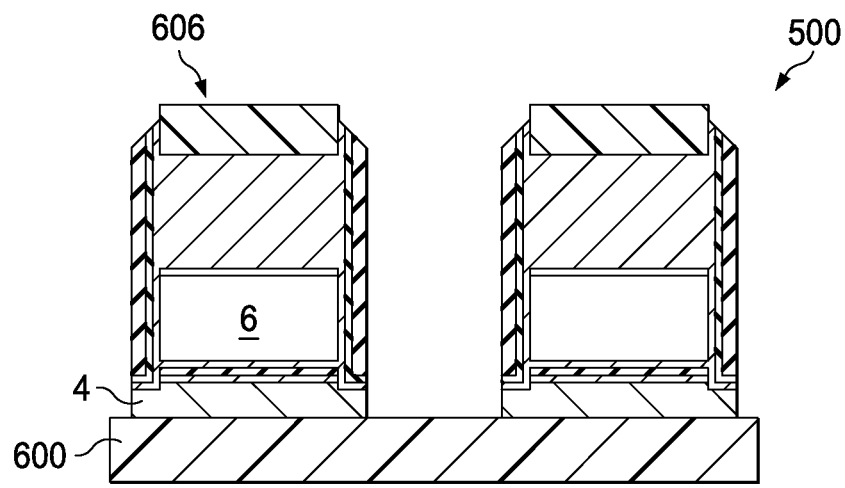

FIG. 6b illustrates a cross-sectional view of structure 500 of flash memory cells after a floating gate polysilicon etch has been performed. The floating gate polysilicon etch may be used to remove portions of second layer 604 not covered by gate stacks, such as gate stack 606. The floating gate polysilicon etch may be stopped sooner than a typical gate polysilicon etch used in flash memory cell fabrication so that a significant sharp point is not formed in the remaining portions of second layer 604. A wet etch may be preferred to help reduce the formation of a sharp point. Remaining portions of second layer 604 may form floating gates, such as floating gate 4 of gate stack 606.

Figure 6C:
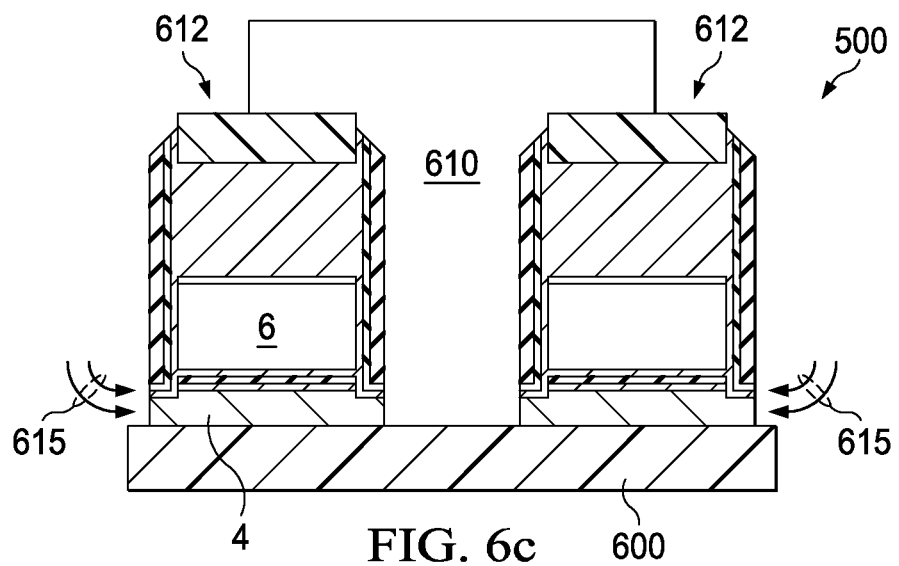

FIG. 6c illustrates a cross-sectional view of structure 500 of flash memory cells after photo resist has been applied, patterned, and removed, as well as a chemical dry etch (CDE) has been performed. Although the floating gate polysilicon etch may have been halted sooner than normal to help prevent the formation of a significant sharp point in the polysilicon of the floating gates, the floating gate polysilicon may still have an irregular surface, which may lead to increased failures once flash memory cell fabrication completes.

A CDE may be used to help smooth out the surface of the polysilicon of the floating gates. However, it may be desired that only the surface of the polysilicon of the floating gate that interfaces with the word-lines may be made smoother. Therefore, photo resist may be applied to substrate 600 (for example, by spin on techniques), patterned (either with positive or negative patterning), and removed, portions of photo resist left remaining include portions of structure 600 of flash memory cells where erase gates will be formed in subsequent fabrication process steps (shown as photo resist 610). Photo resist is removed over portions of structure 500 of flash memory cells where word-lines will be formed in subsequent fabrication process steps (shown as pointers 612), and so forth.

With the photo resist applied, patterned, and removed, a CDE may then be used to smooth out irregularities in the polysilicon of the floating gate that interfaces with the word-lines (shown as arrows 615). Preferably, a CDE lateral etch is performed. The application of the CDE may be timed to ensure that major irregularities, such as sharp points, in the surface of the polysilicon may be eliminated without cutting too deeply into floating gate 4.

Figure 6D:
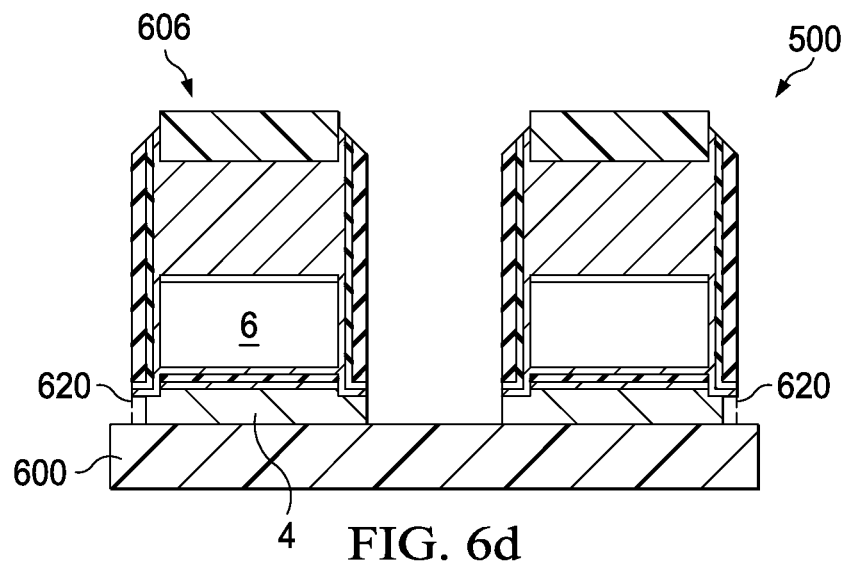

FIG. 6d illustrates a cross-sectional view of structure 500 of flash memory cells after completion of a CDE etch to remove surface irregularities on a surface of floating gates, such as floating gate 4, which will interface with a word-line that will be fabricated in subsequent fabrication process steps, and removal of photo resist. The CDE etch may result in an undercutting of a sidewall of gate stacks, such as gate stack 606, and produce an overhang (shown in FIG. 6d as missing floating gate material referenced to dotted vertical line 620). The overhang may help to protect the surface of the floating gates in subsequent fabrication process steps.

Figure 6E:
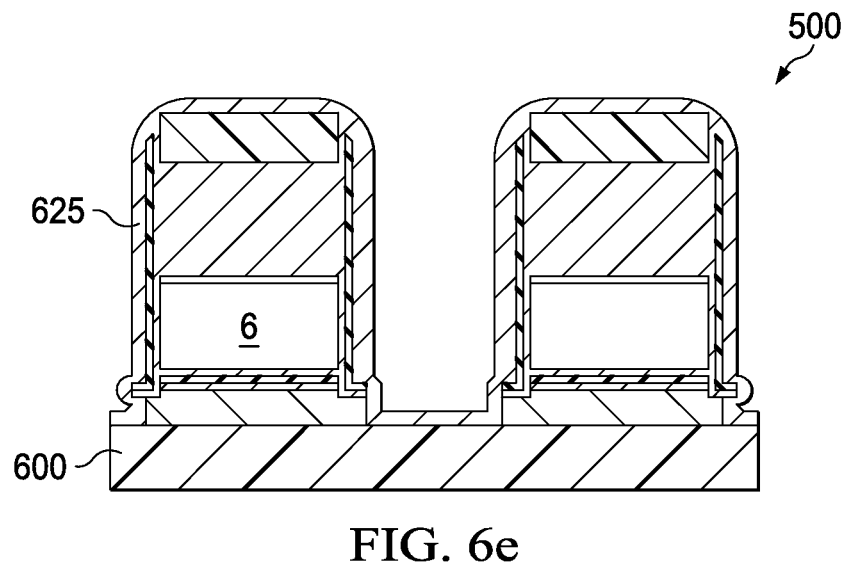

FIG. 6e illustrates a cross-sectional view of structure 500 of flash memory cells after completion of a HTO deposition. Preferably, the HTO deposition will form an oxide layer 625 of a specified thickness over structure 500 of flash memory cells as well as substrate 600. The overhang created by undercutting of a sidewall of gate stacks may remain in place after the formation of oxide layer 625. Fabrication of structure 500 of flash memory cells may continue to completion with known fabrication process steps, which may include the formation of word-lines, erase gates, and so forth.

The embodiments discussed herein provide two different structures (and methods for making thereof) to help reduce leakage current and to prevent induced tunneling voltage failure. In a first structure, the inclusion of an isolation layer between floating gates and word-lines, a consistent oxide layer may be formed to help reduce induced reverse tunneling voltage failure, while the isolation layer may help improve leakage current performance. In a second structure, the elimination of a sharp point in a floating gate surface at an interface with a word-line may help to reduce program function failures and increase yield.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
    a semiconductor substrate;
    a first floating gate disposed on the semiconductor substrate;
    a first conductive line adjacent to the first floating gate;
    a second conductive line adjacent to a side of the first floating gate opposite the first conductive line;
    a first control gate disposed on the first floating gate, wherein a top surface of the second conductive line is above a bottom surface of the first control gate;
    a first separation layer disposed between the first control gate and the first floating gate; and
    a first spacer extending up a side of the first floating gate and the first control gate, the first spacer comprising a first plurality of first spacer layers disposed between the first floating gate and the first conductive line and a second plurality of first spacer layers disposed between the first control gate and the first conductive line, wherein the first plurality of first spacer layers has fewer layers than the second plurality of first spacer layers, wherein the first plurality of first spacer layers and the second plurality of first spacer layers comprise at least one common spacer layer, and wherein the at least one common spacer layer is a continuous layer laterally adjacent at least a portion of the first floating gate, the first separation layer, and the first control gate.

2. The semiconductor structure of claim 1, wherein the first plurality of first spacer layers comprises:
   a first oxide layer disposed between the first floating gate and the first conductive line; and
   a first isolation layer disposed between the first conductive line and the first oxide layer.

3. The semiconductor structure of claim 2, wherein the second plurality of first spacer layers comprises:
   the first oxide layer and the first isolation layer disposed between the first control gate and the first conductive line; and
   a second isolation layer disposed between the first oxide layer and the first control gate.

4. The semiconductor structure of claim 1, further comprising:
   a second spacer disposed between the first floating gate and the second conductive line.

5. The semiconductor structure of claim 1, wherein the first conductive line is a first word-line and the second conductive line is an erase gate.

6. The semiconductor structure of claim 1, further comprising:
   a second floating gate adjacent to the second conductive line on a side of the second conductive line opposite the first floating gate;
   a second control gate disposed on the second floating gate;
   a third conductive line adjacent to the second floating gate on a side of the second floating gate opposite the second conductive line;
   a second separation layer disposed between the second control gate and the second floating gate; and
   a second spacer extending up a side of the second floating gate and the second control gate, the second spacer comprising a first plurality of second spacer layers disposed between the second floating gate and the third conductive line and a second plurality of second spacer layers disposed between the second control gate and the third conductive line, wherein the first plurality of second spacer layers has fewer layers than the second plurality of second spacer layers.

7. The semiconductor structure of claim 6, wherein the first plurality of second spacer layers comprises:
   a first oxide layer disposed between the second floating gate and the third conductive line; and
   a first isolation layer disposed between the third conductive line and the first oxide layer.

8. The semiconductor structure of claim 6, further comprising, a common source region disposed in the semiconductor substrate and in between the first floating gate and the second floating gate.

9. The semiconductor structure of claim 6, wherein the third conductive line is a word-line.

10. A semiconductor structure comprising:
    a semiconductor substrate;
    a first floating gate disposed on the semiconductor substrate;
    a first word-line adjacent to the first floating gate;
    an erase gate adjacent to a side of the first floating gate opposite the first word-line;
    a first control gate disposed on the first floating gate;
    a first separation layer disposed between the first control gate and the first floating gate;
    a first spacer extending up a side of the first floating gate and the first control gate, the first spacer comprising a first plurality of first spacer layers disposed between the first floating gate and the first word-line and a second plurality of first spacer layers disposed between the first control gate and the first word-line, wherein the first plurality of first spacer layers has fewer layers than the second plurality of first spacer layers; and
    a second spacer disposed between the first control gate and the erase gate, wherein the second spacer comprises a first oxide layer disposed between the first control gate and the erase gate and a first isolation layer disposed between the first oxide layer and the erase gate, wherein the first oxide layer is laterally adjacent the first control gate and the first isolation layer.

11. The semiconductor structure of claim 10, wherein the first plurality of first spacer layers comprises:
    a first oxide layer disposed between the first floating gate and the first word-line; and
    a first isolation layer disposed between the first word-line and the first oxide layer.

12. The semiconductor structure of claim 11, wherein the first isolation layer of the first plurality of first spacer layers is about 70 Å thick.

13. The semiconductor structure of claim 11, wherein the first oxide layer of the first plurality of first spacer layers is about 150 Å thick.

14. The semiconductor structure of claim 11, wherein the second plurality of first spacer layers comprises:
    the first oxide layer and the first isolation layer of the first plurality of first spacer layers disposed between the first control gate and the first word-line; and
    a second isolation layer disposed between the first oxide layer of the first plurality of first spacer layers and the first control gate.

15. The semiconductor structure of claim 10, wherein the first spacer is thicker than the second spacer.

16. The semiconductor structure of claim 10, further comprising:
    a second floating gate adjacent to the erase gate on a side of the erase gate opposite the first floating gate;
    a second control gate disposed on the second floating gate;
    a second word-line adjacent to the second floating gate on a side of the second floating gate opposite the erase gate;
    a second separation layer disposed between the second control gate and the second floating gate; and
    a third spacer extending up a side of the second floating gate and the second control gate, the third spacer comprising a first plurality of third spacer layers disposed between the second floating gate and the second word-line and a second plurality of third spacer layers disposed between the second control gate and the second word-line, wherein the first plurality of third spacer layers has fewer layers than the second plurality of third spacer layers.

17. The semiconductor structure of claim 16, wherein the first plurality of third spacer layers comprises:
    a first oxide layer disposed between the second floating gate and the second word-line; and
    a first isolation layer disposed between the second word-line and the first oxide layer of the first plurality of third spacer layers.

18. The semiconductor structure of claim 16, further comprising, a common source region disposed in the semiconductor substrate and in between the first floating gate and the second floating gate.

19. The semiconductor structure of claim 16, further comprising a fourth spacer disposed between the erase gate and the second control gate, wherein the fourth spacer is separated from the second spacer by the erase gate, and wherein no portion of the fourth spacer is in contact with the second spacer.

20. A semiconductor structure comprising:
a semiconductor substrate;
a floating gate disposed on the semiconductor substrate;
a first conductive line adjacent to the floating gate;
a second conductive line adjacent to a side of the floating gate opposite the first conductive line;
a control gate disposed on the floating gate, wherein a top surface of the second conductive line is above a bottom surface of the control gate;
a separation layer disposed between the control gate and the floating gate;
a first spacer extending up a first side of the floating gate and the control gate, wherein the first spacer comprises:
 a first plurality of spacer layers disposed between the floating gate and the first conductive line, wherein the first plurality of spacer layers comprises a first oxide layer and a first nitride layer between the first oxide layer and the first conductive line, and wherein the first nitride layer protects at least a portion of a sidewall of the floating gate; and
 a second plurality of spacer layers disposed between the control gate and the first conductive line, wherein the second plurality of spacer layers comprises the first oxide layer, the first nitride layer, and a second nitride layer disposed between the control gate and the first oxide layer; and
a second spacer extending up a second side of the control gate opposite the first spacer, wherein the second spacer comprises a third oxide layer adjacent to the control gate and a third nitride layer disposed between the third oxide layer and the second conductive line.

* * * * *